US011415613B2

(12) United States Patent
Murata et al.

(10) Patent No.: US 11,415,613 B2
(45) Date of Patent: Aug. 16, 2022

(54) ELECTRIC FIELD DETECTION DEVICE AND ELECTRIC FIELD DETECTOR

(71) Applicants: MIE UNIVERSITY, Tsu (JP); National Institute of Advanced Industrial Science and Technology, Tokyo (JP); SEIKOH GIKEN Co., Ltd., Matsudo (JP)

(72) Inventors: Hiroshi Murata, Tsu (JP); Satoru Kurokawa, Tsukuba (JP); Yoshikazu Toba, Matsudo (JP); Masahiro Sato, Matsudo (JP)

(73) Assignees: MIE University, Tsu (JP); National Institute of Advanced Industrial Science and Technology, Tokyo (JP); SEIKOH GIKEN Co., Ltd., Matsudo (JP)

( * ) Notice: Subject to any disclaimer, the term of this patent is extended or adjusted under 35 U.S.C. 154(b) by 378 days.

(21) Appl. No.: 16/823,345

(22) Filed: Mar. 19, 2020

(65) Prior Publication Data
US 2020/0300901 A1    Sep. 24, 2020

(30) Foreign Application Priority Data
Mar. 21, 2019 (JP) .............................. JP2019-53978
Jun. 27, 2019 (JP) ............................. JP2019-120210

(51) Int. Cl.
*G01R 29/08* (2006.01)
*G02F 1/035* (2006.01)
(Continued)

(52) U.S. Cl.
CPC ......... *G01R 29/0878* (2013.01); *G01R 15/24* (2013.01); *G02F 1/011* (2013.01);
(Continued)

(58) Field of Classification Search
CPC .. G01R 29/0878; G01R 15/24; G01R 15/241; G01R 29/0885; G02F 1/011; G02F 1/035;
(Continued)

(56) References Cited

U.S. PATENT DOCUMENTS

| 7,062,115 B1 * | 6/2006 | Anderson | ............... G02F 1/225 |
| | | | 356/477 |
| 11,340,399 B2 * | 5/2022 | Wang | .................... B81B 3/0018 |

(Continued)

FOREIGN PATENT DOCUMENTS

| JP | H11-352165 A | 12/1999 |
| JP | 2007-078633 A | 3/2007 |

(Continued)

*Primary Examiner* — Ellen E Kim
(74) *Attorney, Agent, or Firm* — Yokoi & Co., U.S.A.; Toshiyuki Yokoi

(57) ABSTRACT

An optical waveguide 1, an optical waveguide 2 are formed on a substrate 3 to be crossed with each other, modulator electrodes 11, 12, 13 and 14 are arranged along the optical waveguides 1, 2, and antennas 21, 22, 23, 24 (i.e., square patch antennas having an approximately same shape) are arranged around four corners of the square shape. The modulator electrode 11 is energized from the antenna 21 and the antenna 22, the modulator electrode 12 is energized from the antenna 24 and the antenna 23, the modulator electrode 13 is energized from the antenna 21 and the antenna 24, and the modulator electrode 14 is energized from the antenna 22 and the antenna 23. The light wave propagating through the optical waveguide 1 is modulated by an electric field of Y-direction, and the light wave propagating through the optical waveguide 2 is modulated by an electric field of X-direction.

14 Claims, 7 Drawing Sheets

(51) Int. Cl.
    *H01Q 9/16*    (2006.01)
    *H01Q 9/04*    (2006.01)
    *G02F 1/01*    (2006.01)
    *G02F 1/225*   (2006.01)
    *G01R 15/24*   (2006.01)
    *G02B 6/12*    (2006.01)

(52) U.S. Cl.
    CPC .............. *G02F 1/035* (2013.01); *G02F 1/225* (2013.01); *H01Q 9/0407* (2013.01); *H01Q 9/16* (2013.01); *G02B 2006/12142* (2013.01); *G02F 2201/12* (2013.01)

(58) Field of Classification Search
    CPC ... G02F 1/225; G02F 2201/12; H01Q 9/0407; H01Q 9/16; G02B 2006/12142
    See application file for complete search history.

(56) References Cited

U.S. PATENT DOCUMENTS

2017/0133756 A1* 5/2017 Eastburg .............. H01Q 25/001
2021/0232045 A1* 7/2021 Shi ....................... H01Q 3/2676

FOREIGN PATENT DOCUMENTS

JP    2014-002005 A    1/2014
JP    2017-009445 A    1/2017

\* cited by examiner

ELECTRIC FIELD DETECTION DEVICE AND ELECTRIC FIELD DETECTOR

CROSS-REFERENCES TO RELATED APPLICATIONS

This patent specification is based on Japanese patent applications, No. 2019-53978 filed on Mar. 21, 2019 and No. 2019-120210 filed on Jun. 27, 2019 in the Japan Patent Office, the entire contents of which are incorporated by reference herein.

BACKGROUND OF THE INVENTION

1. Field of the Invention

The present invention relates to a device and apparatus for detecting an electric field such as an electromagnetic wave. In particular, the present invention relates to an electric field detection device and an electric field detector for detecting the signal of the electromagnetic wave by converting it into an optical signal.

2. Description of the Related Art

For example, when an electromagnetic noise is detected in the field of EMC, an electromagnetic wave intensity is measured in an immunity test or the like, and an electromagnetic wave emitted from a transmission antenna for broadcast and communication is monitored, it is required to correctly measure an electric field strength and a phase of the electromagnetic wave at an arbitrary location. Conventionally, as the electric field detection device for detecting the electric field for the purpose described above, a photoelectric field sensor for modulating an incident light input by an optical fiber in accordance with the electric field strength at that place and outputting it by the optical fiber is used. The modulated output light is converted into an electric signal by using an O/E converter and the electric field strength is measured by the electric signal. Since the photoelectric field sensor and the optical fiber are mainly made of a non-metal material, the strength and phase characteristic of the electromagnetic wave can be correctly measured without influenced by the induction caused by the measured electromagnetic wave, electromagnetic noise, lightning and the like.

In general, the principle of operation of the photoelectric field sensor is that an optical waveguide, a modulator electrode installed around the optical waveguide and an antenna are formed on a substrate (e.g., lithium niobate crystal substrate) made of a material having an electro-optic effect, and the phase of the light wave passing through the optical waveguide is modulated by applying the voltage induced on the antenna by an electric field of an electromagnetic wave or the like to the modulator electrode. In this case, the antenna is integrally formed on the substrate or installed outside the substrate. As conventional examples of the above described photoelectric field sensor, the photoelectric field sensor corresponding to higher frequency is disclosed in Patent Document 1, and the photoelectric field sensor capable of detecting the electric field in three-axis directions is disclosed in Patent Document 2. In addition, examples of the system of measuring the electromagnetic wave using the photoelectric field sensor are disclosed in Patent Documents 3 and 4.

[Patent Document 1] Japanese Patent Application Laid-Open No. H11-352165
[Patent Document 2] Japanese Patent Application Laid-Open No. 2007-78633
[Patent Document 3] Japanese Patent Application Laid-Open No. 2014-2005
[Patent Document 4] Japanese Patent Application Laid-Open No. 2017-9445

BRIEF SUMMARY OF THE INVENTION

When detecting the electric field of the electromagnetic wave, it is required to grasp the maximum electric field strength and polarization state of the electromagnetic wave in many cases. However, in the conventional photoelectric field sensor, it is general that an electric field component in only one direction can be detected by one device. Thus, in order to achieve the above described purpose, it is required to measure the electric field while changing the direction of the antenna installed on the device and complicated operation is required for measuring the maximum electric field strength and polarization state. Therefore, the conventional photoelectric field sensor cannot be used for the purpose of monitoring the polarization state by placing it at an arbitrary location to be measured.

On the other hand, in the photoelectric field sensor disclosed in Patent Document 2, three photoelectric field sensors having three antennas of different directions are combined to enable to detect the electric field component in three-axis directions. However, there are following problems. The entire shape becomes larger since three devices are used. It is difficult to measure the electromagnetic wave at an arbitrary location to be measured. Strictly speaking, the detection positions of the electric field components are different from each other. If the entire shape is made smaller, sufficient sensitivity cannot be obtained.

If the electric field components in two axis directions orthogonally crossed each other can be obtained, the electric field of the electromagnetic wave can be calculated an arbitrary location to be measured. Thus, the electric field detection device capable of measuring the electric field of two axis directions orthogonally crossed each other by one device and capable of increasing sensitivity has been desired to be developed.

The present invention provides a small-sized electric field detection device capable of measuring the electric field component in two axis directions orthogonally crossed each other and capable of increasing sensitivity and an electric field detector using the above described electric field detection device.

The first viewpoint of the present invention provides an electric field detection device, having: a substrate made of a material having an electro-optic effect; first and second optical waveguides formed on the substrate and crossed with each other; four modulator electrodes prepared for applying an electric field to the first optical waveguide and the second optical waveguide; and four patch antennas arranged on the substrate, wherein the four patch antennas are comprised of first, second, third and fourth patch antennas arranged respectively around four corners of a rectangular shape in clockwise order, the first optical waveguide is arranged to pass between the first and second patch antennas and between the third and fourth patch antennas, the second optical waveguide is arranged to pass between the first and fourth patch antennas and between the second and third patch antennas, the four modulator electrodes are comprised of: a first modulator electrode energized from the first and second patch antennas; a second modulator electrode energized from the fourth and third patch antennas; a third modulator electrode energized from the first and fourth patch antennas; and a fourth modulator electrode energized from the second and third patch antennas, the first modulator electrode and the second modulator electrode are arranged along the first optical waveguide, the third modulator electrode and the fourth modulator electrode are arranged along the second optical waveguide, a first light wave propagating through the first optical waveguide is modulated by a first voltage signal induced between the first and second patch antennas and a second voltage signal induced between the third and fourth patch antennas, and a second light wave propagating through the second optical waveguide is modulated by a third voltage signal induced between the first to fourth patch antennas and a fourth voltage signal induced between the second and third patch antennas.

As described above, in the present invention, the first, second, third and fourth patch antennas arranged respectively around four corners of a rectangular shape in clockwise order receive the electric field of the electromagnetic wave to be measured. First, the voltage induced between the first and second patch antennas is applied to the first modulator electrode, and the voltage induced between the fourth and third patch antennas is applied to the second modulator electrode. The light wave propagating through the first optical waveguide is modulated by the first and second modulator electrodes. The direction of connecting the first and second patch antennas is same as the direction of connecting the third and fourth patch antennas. If the above described direction is defined as Y-direction, the phase of the light wave propagating through the first optical waveguide is modulated by the electric field component in the Y-direction of the electromagnetic wave to be detected.

Similarly, the voltage induced between the first and fourth patch antennas is applied to the third modulator electrode, and the voltage induced between the second and third patch antennas is applied to the fourth modulator electrode. The light wave propagating through the second optical waveguide is modulated by the third and fourth modulator electrodes. The direction of connecting the first and fourth patch antennas and the direction of connecting the second and third patch antennas are both orthogonal to the Y-direction. If the above described direction is defined as X-direction, the phase of the light wave propagating through the second optical waveguide is modulated by the electric field component in the X-direction of the above described electromagnetic wave.

Consequently, when the phase changes of the light waves output from the first and second optical waveguides are detected, the electric field components in the X-direction and Y-direction can be separately measured. Here, the phase change amount of the phase-modulated light waves can be obtained by making the light waves interfere with the reference light and then converting them into an electric signal by using an O/E converter or measuring the amplitude of the sideband of the modulation light component by an optical spectrum analyzer, for example.

If two branch interference type optical waveguides are formed by the first and second optical waveguides respectively and Mach-Zehnder type modulator is formed by combining them with the modulator electrodes, the intensity-modulated output light modulated by the electric field components in the X-direction and Y-direction of the electromagnetic wave can be obtained. In this case, a branch interference type optical waveguide can be separately provided on each of the first and second modulator electrodes or each of the third and fourth modulator electrodes. Alternatively, both the first and second modulator electrodes can be arranged on a branch interference type optical waveguide and the third and fourth modulator electrodes can be arranged on another branch interference type optical waveguide.

In addition, a typical substrate having an electro-optic effect used for the present invention is a lithium niobate crystal substrate. In this case, X-cut substrate can be also used in addition to the Z-cut substrate. In either substrate, the modulator electrodes are formed so that the electric field is applied in the Z-axis direction.

In the present invention, the modulation voltage is applied to the light wave propagating through the first optical waveguide by the two first and second modulator electrodes, and the modulation voltage is applied to the light wave propagating through the second optical waveguide by the two third and fourth modulator electrodes. In general, the modulation efficiency of the light wave propagating through the optical waveguide increases depending on the length of the portion to which the modulation voltage is applied. On the other hand, when the frequency is high, the influence of the electrode capacitance increases as the frequency increases, and the modulation efficiency is reduced when the phase change of the voltage signal is faster than the time required for the optical signal to propagate thorough the electrode length. Thus, in order to perform the modulation efficiently, the length of one modulator electrode should be shortened. In the present invention, since the modulator electrodes are located at two positions, the efficiency can be improved and the sensitivity of detecting the electric field can be improved compared to the conventional case where the modulation is performed by one modulator electrode. As described above, in the present invention, the voltage can be induced on two modulator electrodes in the X-direction and Y-direction by newly invented arrangement of four patch antennas which did not conventionally exist. Thus, the modulation can be efficiently performed. In addition, since the electric field detection device can be formed on one substrate, downsizing is possible.

When the frequency is low, it is possible to apply the modulation voltage to two modulator electrodes at the same phase. However, when the frequency is high, the modulation of the optical signal modulated by the first modulator electrode is canceled when the voltage having an opposite polarity is applied when propagating through the optical waveguide part of the second modulator electrode. Thus, it is required to adjust the phase of the modulation voltage applied by the second modulator electrode in accordance with the propagation of the optical signal modulated by the first modulator electrode in the optical waveguide.

Any antennas can be used for the four patch antennas of the present invention as long as the antenna has a reception sensitivity to the electromagnetic wave having the frequency to be measured and the antenna generates the modulation voltage. For example, a square patch antenna and a circular patch antenna and the like can be used. The shape of the antenna can be designed based on the frequency band and the modulation voltage to be required. In this case, it is not necessary to form all of the four patch antennas in the same shape. However, it is preferable that all of the four patch antennas induce the same modulation voltage with respect to the same electric field strength in the X-direction and Y-direction. In addition, the four patch antennas are arranged around four corners of a rectangular shape so that the four patch antennas face to each other in the X-direction and Y-direction. The electric field detection device can be most easily designed when the four patch antennas are arranged around the corners of a square shape so that the distances of the patch antennas become equal and the four patch antennas are formed in the same shape. Even when the detection sensitivity is different between the X-direction and the Y-direction, it can be corrected after the electric field if the sensitivity ratio is constant.

In the second viewpoint of the present invention, in the electric field detection device of the first viewpoint, the first to fourth modulator electrodes are configured to resonate at frequencies of the first to fourth voltage signals induced on the four patch antennas respectively.

When the frequency to be detected is set to high, the modulation efficiency decreases as the length of the modulator electrode becomes shorter as described above. In the second viewpoint of the present invention, in order to increase the modulation efficiency also in the above described high-frequency band, the modulator electrodes are formed to have a resonance-type electrode structure to increase the voltage to be applied. As the above described resonance-type modulator electrodes, the conventional structure of a microwave resonator having a planar circuit can be applied. It is enough if the increased voltage is induced by the resonance at the portion of the modulator electrodes installed along the optical waveguide.

In the third viewpoint of the present invention, in the electric field detection device of the second viewpoint, each of the four modulator electrodes has a pair of strip-shaped electrode portions arranged to face each other at a predetermined interval along the first optical waveguide or the second optical waveguide, and a resonator is configured by short-circuiting or opening both ends of the pair of strip-shaped electrode portions.

In the third viewpoint of the present invention, a pair of strip-shaped electrode portions is used as a general modulator electrodes. In case of the Z-substrate of the lithium niobate crystal substrate, one of the strip-shaped electrode portions is arranged on the optical waveguide and the other is arranged to face it at a predetermined interval. In case of the X-cut substrate, two strip-shaped electrode portions are arranged to face each other sandwiching the optical waveguide. In order to form the resonance-type electrode by using the above described electrode portions, the two strip-shaped electrode portions are regarded as a microwave line and the length of the microwave line is selected in accordance with the frequency. Thus, a reflective end is formed by short-circuiting or opening both ends and the electrode portions can be resonated. The electrode portions forms a so-called standing wave resonant electrode.

In the fourth viewpoint of the present invention, in the electric field detection device of the third viewpoint, the first light wave modulated by the first modulator electrode is configured to increase the modulation degree when the first light wave passes through the second modulator electrode, and the second light wave modulated by the third modulator electrode is configured to increase the modulation degree when the second light wave passes through the fourth modulator electrode.

When the frequency of the electromagnetic wave is high, in order to efficiently perform the modulation in the present invention by two modulator electrodes installed on the first optical waveguide and two modulator electrodes installed on the second optical waveguide, it is required to adjust the phase of the modulation voltage applied by the second modulator electrode in accordance with the propagation of the optical signal modulated by the first modulator electrode in the optical waveguide. For example, when the refraction index is 2.2 in the lithium niobate crystal substrate, the speed of the light wave propagating through the optical waveguide is approximately $1.36 \times 10^{11}$ mm/sec. Thus, when the modulation frequency is 30 GHz, the wavelength of the modulation wave in the optical waveguide is approximately 4.55 mm. Therefore, when the optical signal modulated and generated by the first or third modulator electrode reaches the second or fourth modulator electrode, the modulation is added and the modulation degree is increased by adjusting the phase of the voltage signal applied to the second or fourth modulator electrode in accordance with the phase of the reached optical signal.

In the fifth viewpoint of the present invention, in the electric field detection device of the fourth viewpoint, the relative position is different between the pair of strip-shaped electrode portions of the second modulator electrode and the pair of strip-shaped electrode portions of the first modulator electrode in the width direction of the first optical waveguide, the direction of the electric field applied to the first optical waveguide by the second modulator electrode is opposite to the direction of the electric field applied to the first optical waveguide by the first modulator electrode, the relative position is different between the pair of strip-shaped electrode portions of the fourth modulator electrode and the pair of strip-shaped electrode portions of the third modulator electrode in the width direction of the second optical waveguide, and the direction of the electric field applied to the second optical waveguide by the fourth modulator electrode is opposite to the direction of the electric field applied to the second optical waveguide by the third modulator electrode.

In the fifth viewpoint of the present invention, when the phase of the optical signal modulated and generated by the first or third modulator electrode is inverted at the portion of the second or fourth modulator electrode, the modulation can be added by inverting the phase of the voltage signal applied to the second or fourth modulator electrode. In order to achieve the above described purpose, for example, in the Z-cut substrate of the lithium niobate crystal substrate, when the strip-shaped electrode portions connected to a feeder (electric supply line) connected from the first patch antenna are arranged on the optical waveguide in the first modulator electrode, the strip-shaped electrode portions connected to a feeder connected from the third patch antenna which is opposite to the first optical waveguide can be arranged on the optical waveguide in the second modulator electrode. The fifth viewpoint of the present invention is effective when the center interval between the first and second modulator electrodes and the center interval between the third and fourth modulator electrodes are nearly an odd multiple of a half (½) of the wavelength of the modulation wave in the optical waveguide. When the above described intervals are nearer to an even multiple than the odd multiple of a half (½) of the wavelength of the modulation wave in the optical waveguide, it is not required to inverse the phase of the voltage signal.

In the sixth viewpoint of the present invention, in the electric field detection device of the fourth viewpoint, the polarization direction at a second region of the substrate to which the second voltage signal is applied by the second modulator electrode and a fourth region of the substrate to which the fourth voltage signal is applied by the fourth modulator electrode is inverted with respect to the polarization direction at a first region of the substrate to which the first voltage signal is applied by the first modulator electrode and a third region of the substrate to which the third voltage signal is applied by the third modulator electrode. In the sixth viewpoint of the present invention, in the substrate (e.g., lithium niobate crystal substrate) made of a material having an electro-optic effect, positive/negative of the generated refraction index change can be opposite from each other by inverting the polarization direction even when the same electric field is applied. Namely, even when the arrangement of the strip-shaped electrode portions with respect to the optical waveguide is same, the phase of the light wave is changed to have reverse polarity by inverting the polarization of the particular part of the substrate. Thus, the same effect can be obtained as in the case of inverting the phase of the voltage signal to be applied. In the lithium niobate crystal substrate, a polarization inversion region can be formed by applying high electric field in the Z-axis direction of the substrate to the region.

In the seventh viewpoint of the present invention, in the electric field detection device of the fourth viewpoint, a second feeder line for energizing from the third and fourth patch antennas to the second modulator electrode is different from a first feeder line for emerging from the first and second patch antennas to the first modulator electrode, the direction of the electric field applied to the first optical waveguide by the second modulator electrode is opposite to the direction of the electric field applied to the first optical waveguide by the first modulator electrode, a fourth feeder line for energizing from the second and third patch antennas to the fourth modulator electrode is different from a third feeder line for emerging from the first and fourth patch antennas to the third modulator electrode, and the direction of the electric field applied to the second optical waveguide by the fourth modulator electrode is opposite to the direction of the electric field applied to the second optical waveguide by the third modulator electrode.

In the seventh viewpoint of the present invention, even when the arrangement of the strip-shaped electrode portions with respect to the first optical waveguide is same between the first modulator electrode and the second modulator electrode or when the arrangement of the strip-shaped electrode portions with respect to the second optical waveguide is same between the third modulator electrode and the fourth modulator electrode, the phase of the voltage signal applied to the second and fourth modulator electrodes is inversed with respect to the first and third modulator electrodes by changing the length of the feeder line connected from each of the patch antennas, for example. For example, the feeder lines having the same length are connected from the first and second patch antennas to the first modulator electrode, and the length of the feeder lines connected from the fourth and third patch antennas to the second modulator electrode are made different by a half (½) of the wavelength of the microwave propagating through the feeder line. For example, the feeder line can be meandered. In this case, the cross-sectional structure can be made different between the feeder lines for emerging from the third and fourth patch antennas to the second modulator electrode and the feeder lines for emerging from the second and third patch antennas to the fourth modulator electrode in order to achieve the above described difference of the length.

In the eighth viewpoint of the present invention, in the electric field detection device of the first to seventh viewpoints, the four patch antennas are four square patch antennas. When the four patch antennas used for the present invention are four square patch antennas having the same shape, the electric field detection device can be easily designed.

In the ninth viewpoint of the present invention, in the electric field detection device of the eighth viewpoint, the four square patch antennas have first slit portions (i.e., cut portions, notch portions) at both ends of each of the first to fourth feeder lines connected to the four square patch antennas so that impedance is matched between the four square patch antennas and the first to fourth feeder lines for emerging the first to fourth modulator electrodes connected to the four square patch antennas.

In order to efficiently supply the electric signals induced on the square patch antennas to the modulator electrodes via the feeder lines, the impedance should be matched between the square patch antennas and the feeder lines. Therefore, in the ninth viewpoint of the present invention, the slit portions are provided at both ends of the feeder lines connected to the square patch antennas so that impedance is matched between them by adjusting the width and the length of the slit portions.

In the tenth viewpoint of the present invention, in the electric field detection device of the ninth viewpoint, the four square patch antennas have second slit portions having an approximately same shape as the first slit portions, and the second slit portions are located on an opposite side to a side having the first slit portion and at a position symmetric to the first slit portion.

The shape of the square patch antennas is designed so that the square patch antennas resonate at the target reception frequency of the radio wave to output the maximum signal. However, when the slit portions are provided only on the feeder line side of the square patch antennas, the symmetry of the shape is lost and the resonance characteristic is deteriorated. In the tenth viewpoint of the present invention, the slit portions are also provided on an opposite side to the side connected to the feeder lines to make the shape of the square patch antennas symmetrically. Thus, the deterioration of the resonance characteristic due the asymmetric shape of the antennas is improved.

In the eleventh viewpoint of the present invention, in the electric field detection device of the first to tenth viewpoints, the first and second optical waveguides are crossed with each other at an angle of 70° to 110°. In the electric field detection device of the eleventh viewpoint of the present invention, it is required that the signal of the detected electric field in the Y-direction obtained from the emitted light of the first optical waveguide is separated from the signal of the detected electric field in the X-direction obtained from the emitted light of the second optical waveguide. Namely, it is required that the light waves propagating through each of the optical waveguides are not mixed with each other. When the two optical waveguides are crossed with each other, crosstalk does not occur almost at all when the crossing angle is large. In addition, considering the arrangement of the four patch antennas for detecting the electric field in X-direction and Y-direction and the four modulator electrodes, the design is easy when the crossing angle is close to 90°.

In the twelfth viewpoint of the present invention, in the electric field detection device of the first to tenth viewpoints, the wavelength of the first light wave propagating through the first optical waveguide is different from the wavelength of the second light wave propagating through the second optical waveguide. The wavelengths of the light waves propagating through the two optical waveguides are made different, and the emitted light of each of the optical waveguides is extracted through the wavelength filter. Thus, the X-direction and the Y-direction of the signals of the detected electric field can be sufficiently separated.

In the thirteenth viewpoint of the present invention, in the electric field detection device of the first to twelfth viewpoints, the substrate has an approximately rectangular shape in a plan view, each of the first and second optical waveguides has a curved optical waveguide, a light incident end surface of the first and second optical waveguides is formed on one side of the approximately rectangular shape, and a light emission end surface of the first and second optical waveguides is formed on an opposite side of the approximately rectangular shape opposite to the light incident end surface.

When the electric field detection device is put into practical use, in order to facilitate the handling, the optical fiber is preferably connected and fixed to the light incident/emission end surfaces of the first and second optical waveguides. In the thirteenth viewpoint of the present invention, when a crystal substrate having a rectangular shape in a plan view is used, for example, a light incident end surface of the first and second optical waveguides is formed on one side of the rectangular shape, and a light emission end surface of the first and second optical waveguides is formed on an opposite side. Because of this, the end surfaces to be polished for connecting with the optical fiber is only two end surfaces. Thus, the manufacturing process is significantly simplified compared to the case of polishing four end surfaces. In addition, the end surfaces to be connected and fixed to the optical fiber are also only two end surfaces. Thus, the handling is facilitated compared to the case where four end surfaces are connected and fixed.

The fourteenth viewpoint of the present invention provides an electric field detector, having: the electric field detection device of the first to thirteenth viewpoints; a light source for supplying the first and second light waves propagating through the first and second optical waveguides; a processor for converting the first and second light waves emitted from the first and second optical waveguides into an electric signal, outputting a first signal which corresponds to a first electric field signal between the first and second patch antennas and between the fourth and third patch antennas from the electric signal, and outputting a second signal which corresponds to a second electric field signal between the first and fourth patch antennas and between the second and third patch antennas. The electric field detector of the present invention can have: an optical amplifier such as an EDFA; a reference light source and related optical system; an O/E converter as a processor; and a measuring instrument such as an oscilloscope and a spectrum analyzer if needed.

As described above, a small-sized electric field detection device capable of measuring the electric field component in two axis directions orthogonally crossed each other and capable of increasing sensitivity and an electric field detector using the above described electric field detection device can be obtained by the present invention.

BRIEF DESCRIPTION OF THE DRAWINGS

FIG. 3A shows a part of a modulator electrode 11, and FIG. 3B shows a part of a modulator electrode 12.

DETAILED DESCRIPTION OF THE INVENTION

Figure 1:
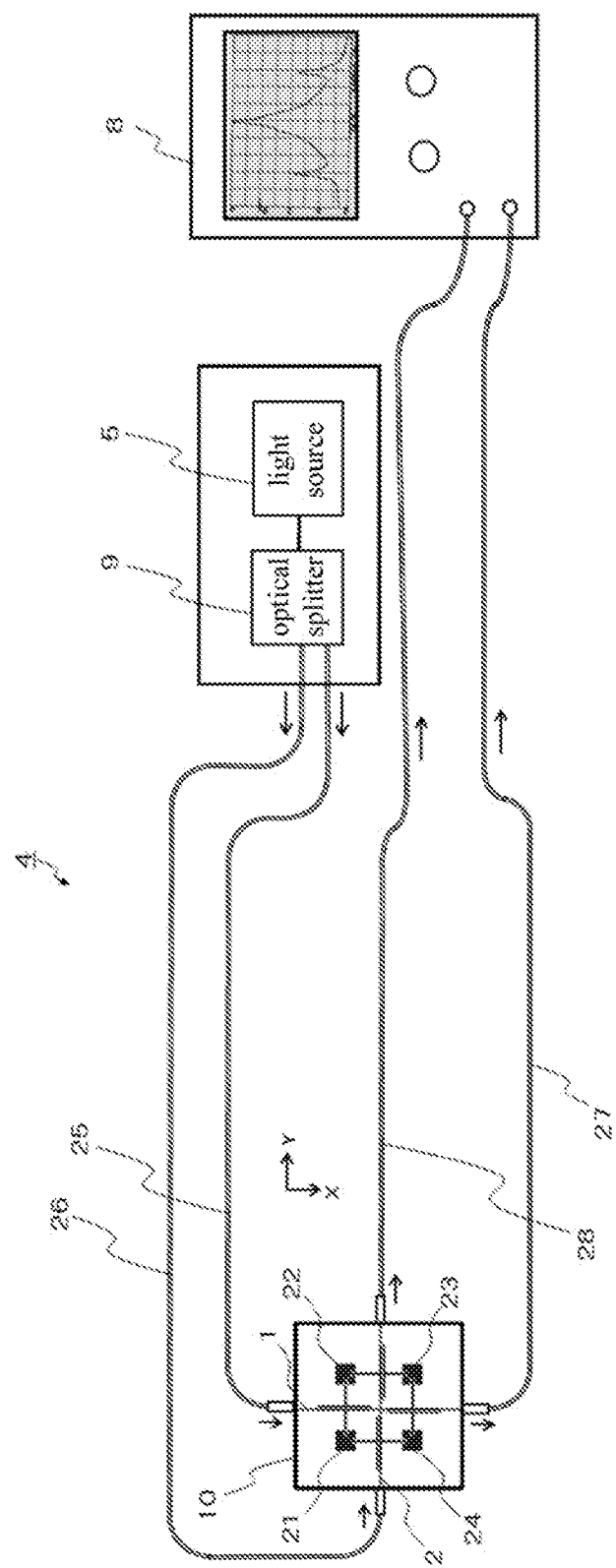
FIG. 1 is a schematic configuration drawing of an electric field detector using an electric field detection device of the first embodiment.

Hereafter, the electric field detection device and the electric field detector of the present invention will be explained in detail by embodiments referring to the drawings. Note that the same reference signs are added to the same elements and the repeated explanation will be omitted.

First Embodiment

Figure 2:
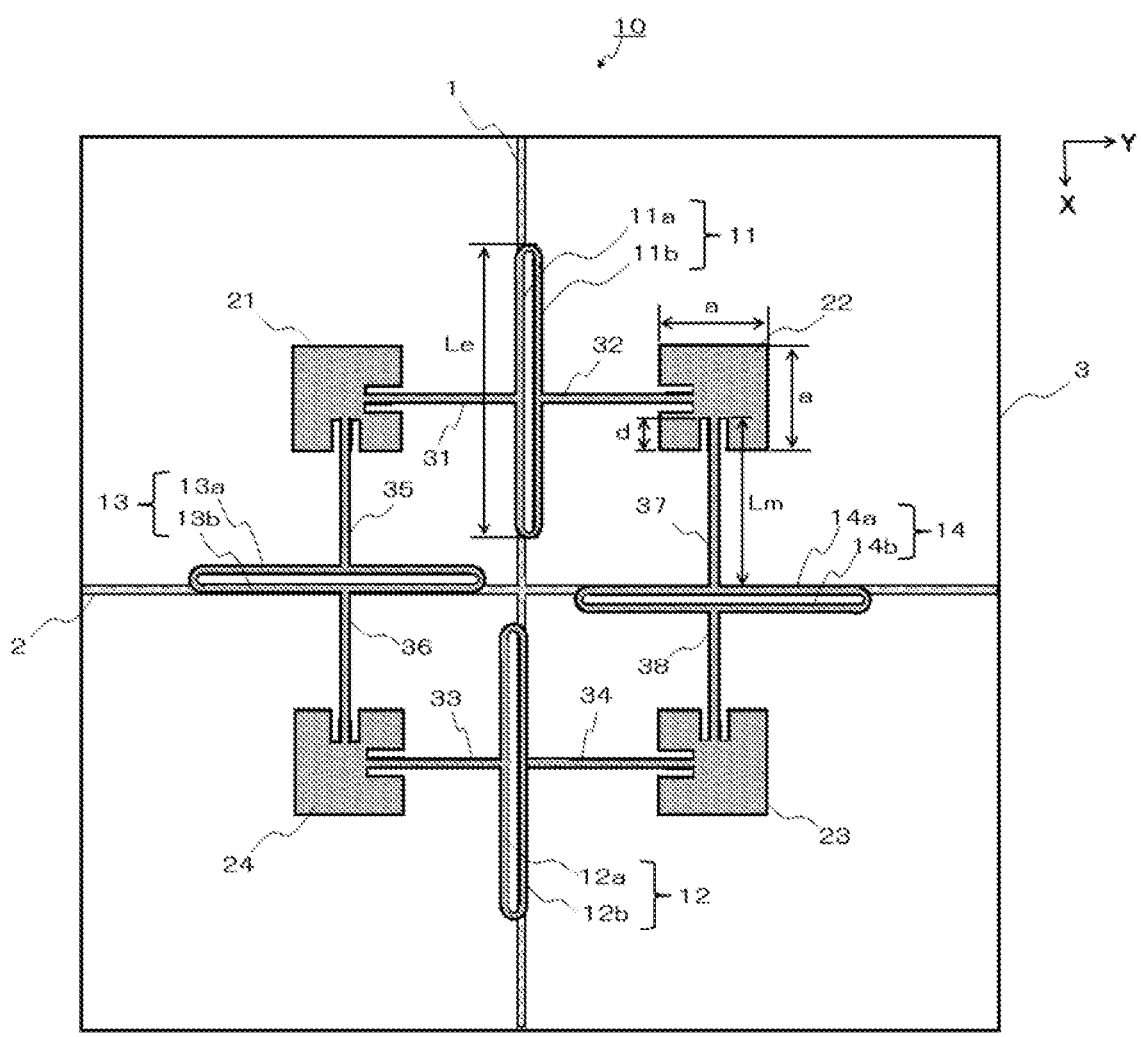
FIG. 2 is a schematic plan view showing the configuration of the electric field detection device of the first embodiment.

FIG. 1 is a schematic configuration drawing of an electric field detector using an electric field detection device of the first embodiment. FIG. 2 is a schematic plan view showing the configuration of the electric field detection device of the first embodiment.

In FIG. 1, an electric field detector 4 of the present invention has an electric field detection device 10, a light source 5, and an optical spectrum analyzer 8 which functions as a processor. The light emitted from the light source 5 is divided into two by an optical splitter 9, passes through optical fibers 25 and 26, and is coupled at an incident end surface of an optical waveguide 1 (i.e., the first optical waveguide) and an optical waveguide 2 (i.e., the second optical waveguide) of the electric field detection device 10. The light waves emitted from an emission end surface of the optical waveguide 1 and the optical waveguide 2 pass through optical fibers 27 and 28 and enter into the optical spectrum analyzer 8. The light emitted from the optical fiber 27 is input to the optical spectrum analyzer 8, and the signal corresponding to the electric field signals induced between an antenna 21 (i.e., first patch antenna) and an antenna 22 (i.e., second patch antenna) and between an antenna 24 (i.e., fourth patch antenna) and an antenna 23 (i.e., third patch antenna) provided on the electric field detection device 10 can be obtained. Namely, the signal corresponding to the electric field signal in the Y-direction can be obtained. Similarly, the light emitted from the optical fiber 28 is input to the optical spectrum analyzer 8, and the signal corresponding to the electric field signals induced between the antenna 21 and the antenna 24 and between the antenna 22 and the antenna 23 can be obtained. Namely, the signal corresponding to the electric field signal in the X-direction can be obtained. In the optical spectrum analyzer 8, the above described electric field signal appears as the sideband of the central optical frequency. Thus, by measuring the magnitude of it, the magnitude of the electric field of the electromagnetic wave in the Y-direction and X-direction at the position of the electric field detection device 10 can be detected.

As shown in FIG. 2, in the electric field detection device 10, the optical waveguide 1 and the optical waveguide 2 linearly crossed with each other at an angle of 90° are formed by titanium-diffuse optical waveguide on a substrate 3 which is the Z-cut substrate made of the lithium niobate crystal substrate (i.e., material having an electro-optic effect). In addition, a modulator electrode 11 and a modulator electrode 12 are provided along the optical waveguide 1 to apply the electric field to the optical waveguide 1, and a modulator electrode 13 and a modulator electrode 14 are provided on the substrate 3 along the optical waveguide 2 to apply the electric field to the optical waveguide 2. The antennas 21, 22, 23, 24 are square patch antennas having an approximately same shape. The antennas 21, 22, 23, 24 are arranged respectively around four corners of a square shape in clockwise order. The optical waveguide 1 is arranged to pass between the antennas 21 and 22 and between the antennas 24 and 23. The optical waveguide 2 is arranged to pass between antennas 21 and 24 and between the antennas 22 and 23.

The modulator electrode 11 is energized by a feeder 31 connected from the antenna 21 and a feeder 32 connected from the antenna 22. The modulator electrode 12 is energized by a feeder 33 connected from the antenna 24 and a feeder 34 connected from the antenna 23. The modulator electrode 13 is energized by a feeder 35 connected from the antenna 21 and a feeder 36 connected from the antenna 24. The modulator electrode 14 is energized by a feeder 37 connected from the antenna 22 and a feeder 38 connected from the antenna 23. Namely, the light wave propagating through the optical waveguide 1 is modulated by the voltage signal induced between the antennas 21 and 22 and the voltage signal induced between the antenna 24 and 23, and the light wave propagating through the optical waveguide 2 is modulated by the voltage signal induced between the antennas 21, 24 and the voltage signal induced between the antennas 22, 23.

Here, the four modulator electrodes 11, 12, 13 and 14 respectively have strip electrodes 11*a*, 11 *b*, strip electrodes 12*a*, 12*b*, strip electrodes 13*a*, 13*b* and strip electrodes 14*a*, 14*b* which are a pair of strip-shaped electrode portions arranged to face each other at a predetermined interval along the optical waveguide 1 or the optical waveguide 2. A resonator is configured by short-circuiting both ends of the pair of the strip electrodes. Namely, a standing wave resonant electrode is formed by each of the pair of the strip electrodes.

Furthermore, in the electric field detection device 10 of the present embodiment, when the phases of the optical signal modulated and generated by the modulator electrodes 11, 13 are inversed at the portions of the modulator electrodes 12, 14 respectively, the modulation can be added by inverting the phase of the voltage signal applied to the modulator electrodes 12, 14. Therefore, in the modulator electrode 11, the strip electrode 11*a* connected with the feeder 31 energized from the antenna 21 is arranged on the optical waveguide 1. In the modulator electrode 12, the strip electrode 12*b* connected with the feeder 34 energized from the antenna 23 which is opposite to the antenna 21 with respect to the optical waveguide 1 is arranged on the optical waveguide 1. Similarly, in the modulator electrode 13, the strip electrode 13*b* connected with the feeder 36 energized from the antenna 24 is arranged on the optical waveguide 2. In the modulator electrode 14, the strip electrode 14*a* connected with the feeder 37 energized from the antenna 22 which is opposite to the antenna 24 with respect to the optical waveguide 2 is arranged on the optical waveguide 2.

Figure 3A:
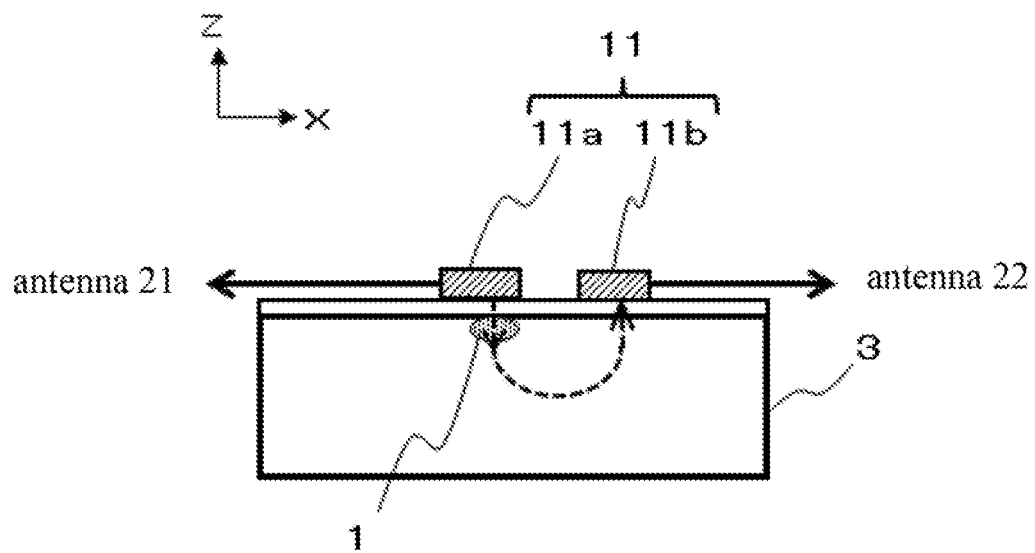
FIGS. 3A and 3B are schematic cross-sectional views for explaining the operation of the electric field detection device of the first embodiment.
Figure 3B:
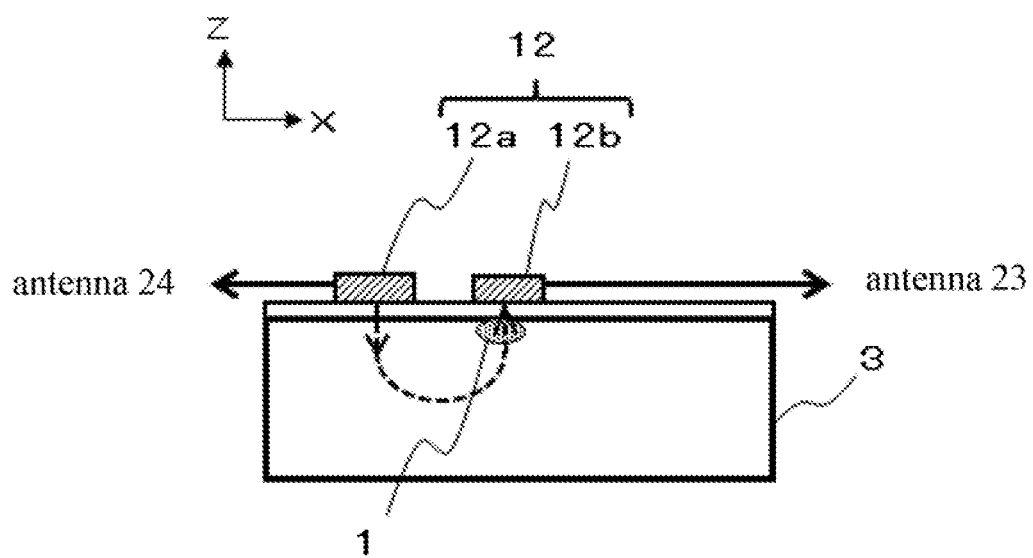

FIGS. 3A and 3B are schematic cross-sectional views for explaining the operation of the electric field detection device of the first embodiment. FIG. 3A shows a part of the modulator electrode 11, and FIG. 3B shows a part of the modulator electrode 12. In the present embodiment, since the shapes of the antennas 21 to 24 are approximately same and the shapes of the feeders 31 to 38 are approximately same, it is considered that the voltage signal induced between the antennas 21 and 22 and applied to the modulator electrode 11 is same as the voltage signal induced between the antennas 23 and 24 and applied to the modulator electrode 12. On the other hand, since the strip electrode 11*a* arranged on the optical waveguide 1 is connected to the antenna 21 and the strip electrode 12*b* arranged on the optical waveguide 1 is connected to the antenna 23, the directions of the electric field applied to the optical waveguide 1 in the substrate 3 are opposite to each other between the modulator electrode 11 and the modulator electrode 12. Because of this, the phases of the voltage signal applied to the modulator electrode 12 can be inversed with each other.

Next, an example of the specific shape of the electric field detection device 10 of the present embodiment is shown. The width of the optical waveguide of the optical waveguides 1, 2 can be approximately 5 to 15 μm, and the depth can be approximately 5 to 10 μm. When the detected frequency of the electromagnetic wave is set to 28 GHz, the length a of one side of the antennas 21 to 24 can be a=1.8 mm, the width of the feeders 31 to 38 can be 50 μm, the length Lm can be Lm=2.6 mm, the length Le of the modulator electrodes 11 to 14 is Le=2.5 mm, the width of the strip electrode 11*a*, 11 *b*, 12*a*, 12*b*, 13*a*, 13*b*, 14*a*, 14*b* can be 30 μm, the opposite interval between each of the pair can be 30 μm, and the length d of the slit portion for matching impedance between the antennas and the feeders is d=0.59 mm, for example.

Second Embodiment

Figure 4:
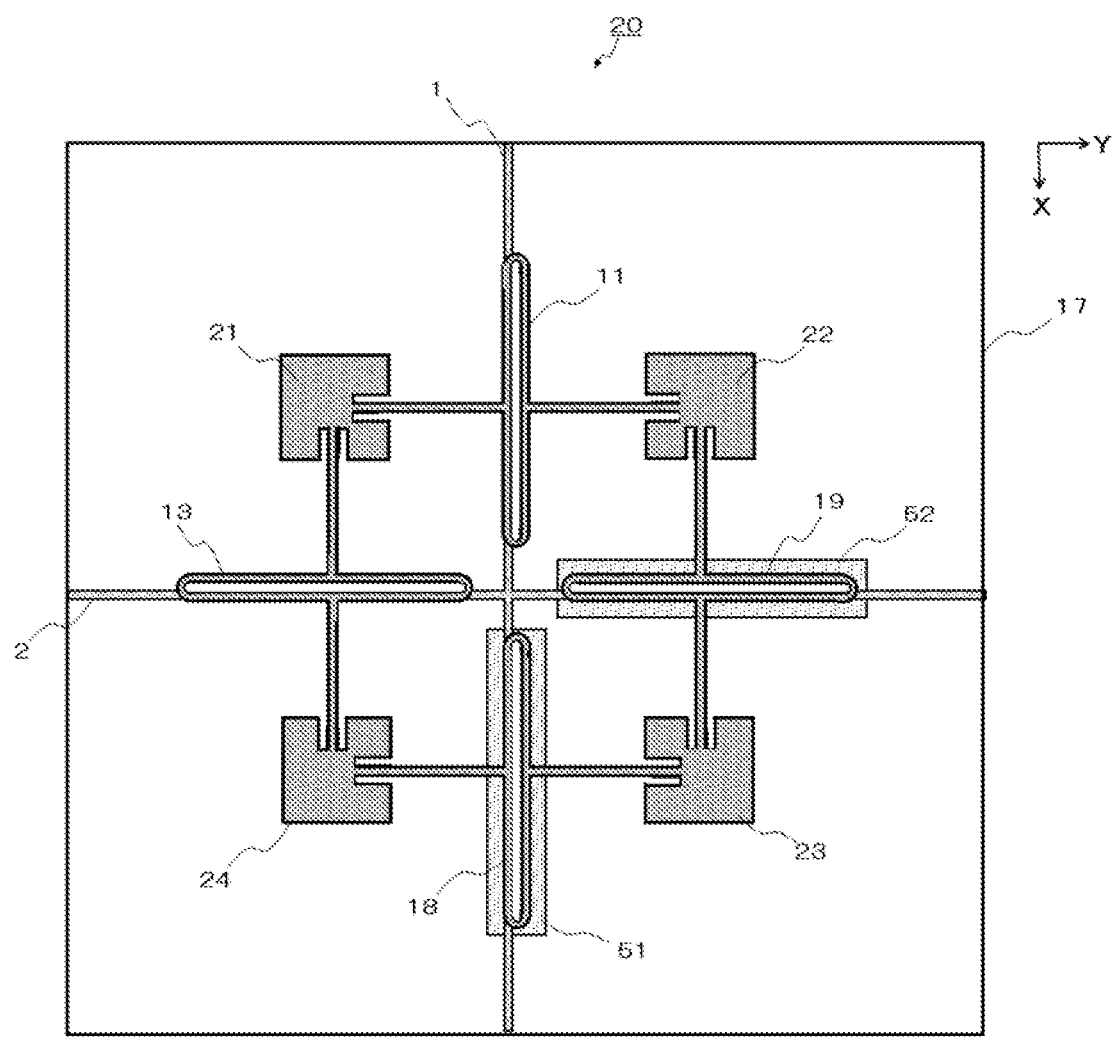
FIG. 4 is a schematic plan view showing the configuration of the electric field detection device of the second embodiment.

FIG. 4 is a schematic plan view showing the configuration of the electric field detection device of the second embodiment. In FIG. 4, an electric field detection device 20 of the present embodiment has the same configuration as the electric field detection device 10 of the first embodiment except for the following points. At the portion where the second modulator electrode and the fourth modulator electrode are formed on the substrate 17, polarization inversion regions 51 and 52 where the polarization direction is inverted are formed on the substrate 17. In addition, the arrangement in the width direction of the strip electrodes forming a modulator electrode 18 (i.e., second modulator electrode) and a modulator electrode 19 (i.e., fourth modulator electrode) is different.

Also in the electric field detection device 20 of the present embodiment, same as the first embodiment, even when the phases of the optical signal modulated and generated by the modulator electrodes 11 and 13 are inversed at the portions of the modulator electrodes 18 and 19 respectively, the modulation can be added. In the present embodiment, the phase of the voltage signal applied to the modulator electrodes 18 and 19 is same as the phase of the voltage signal applied to the modulator electrodes 11 and 13. In the present embodiment, since the polarization direction is inverted at the portion of the modulator electrodes 18 and 19, the polarity of refraction index change to the applied voltage is opposite compared to the portion of the modulator electrodes 11 and 13. Thus, when the phase of the voltage signal is inversed without inverting the polarization direction, the same effect as the electric field detection device 10 of the first embodiment can be obtained.

Third Embodiment

Figure 5:
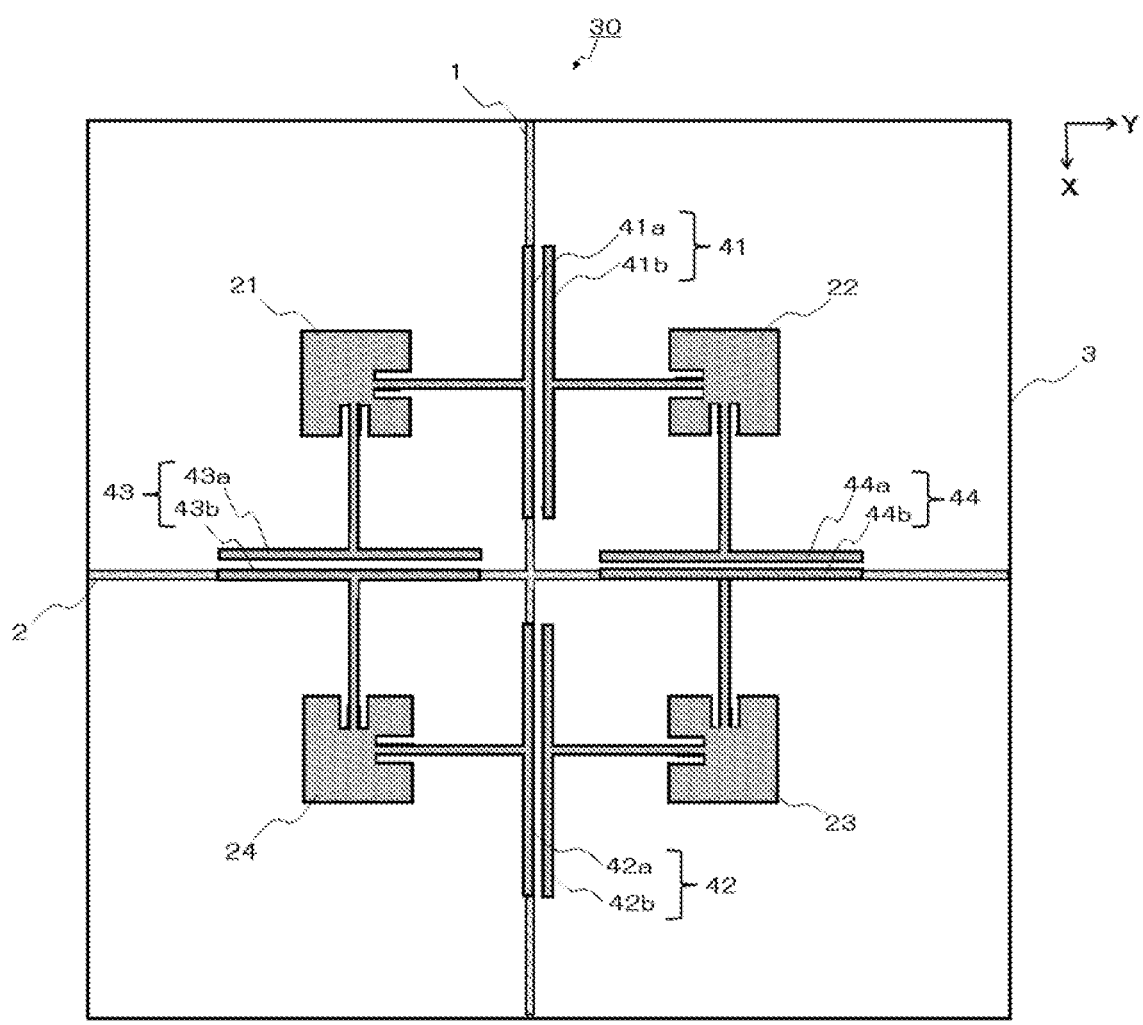
FIG. 5 is a schematic plan view showing the configuration of the electric field detection device of the third embodiment.

FIG. 5 is a schematic plan view showing the configuration of the electric field detection device of the third embodiment. In FIG. 5, an electric field detection device 30 of the present embodiment has the same configuration as the electric field detection device 10 of the first embodiment except for that the first to fourth modulator electrodes are different.

In the electric field detection device 30 of the present embodiment shown in FIG. 5, all of the first to fourth modulator electrodes do not have the resonator structure. Four modulator electrodes 41, 42, 43 and 44 respectively have a pair of strip-shaped electrode portions (i.e., strip electrodes 41a, 41b, strip electrodes 42a, 42b, strip electrodes 43a, 43b and strip electrodes 44a, 44b) arranged to face each other at a predetermined interval along the optical waveguide 1 or the optical waveguide 2. The strip electrodes are arranged in the same manner with respect to the width direction of the optical waveguide. In addition, both ends of the strip electrodes are open.

Here, the electric field detection device 30 of the present embodiment can be used for detecting the electric field of the electromagnetic wave having lower frequency compared to the first embodiment and the second embodiment. For example, it can be used for the case where the length of a half of the wavelength of the modulation wave in the optical waveguide is longer than the length between the incident end of the modulator electrode 41 and the emission end of the modulator electrode 42. In this case, the voltage signal having the same phase can be applied to the modulator electrodes 41, 42. The same applies to the modulator electrodes 43, 44.

Fourth Embodiment

Figure 6:
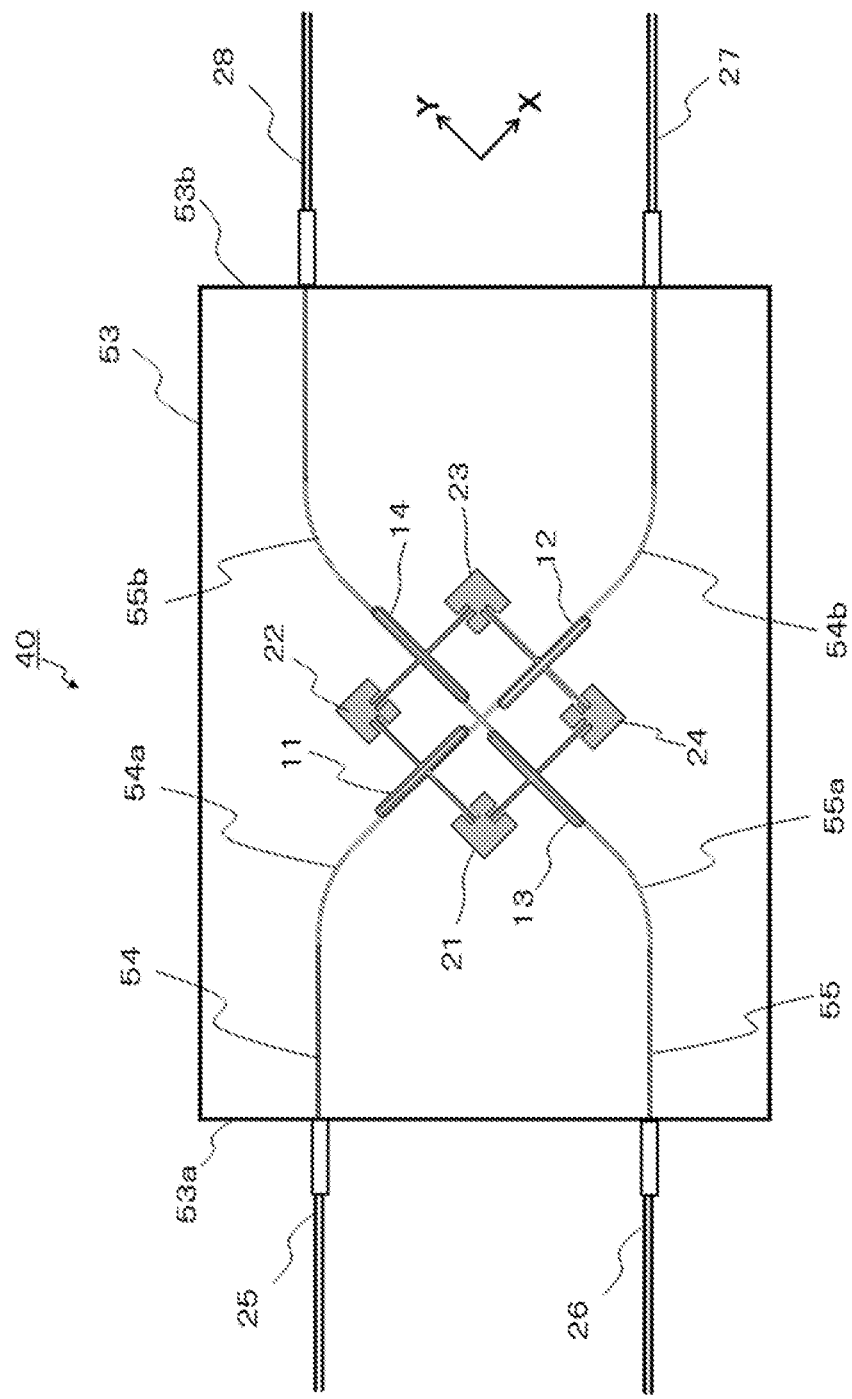
FIG. 6 is a schematic plan view showing the configuration of the electric field detection device of the fourth embodiment.

FIG. 6 is a schematic plan view showing the configuration of the electric field detection device of the fourth embodiment. In FIG. 6, an electric field detection device 40 of the present invention has the same configuration as the electric field detection device 10 of the first embodiment except for that the shape of the substrate and the shape of the first optical waveguide and the second optical waveguide are different. Although the configuration and shape of the four antennas and the four modulator electrodes are same as those of the electric field detection device 10 of the first embodiment in FIG. 6, it is also possible to have the same configuration as the electric field detection device 20 or 30 of the second embodiment or the third embodiment.

In the electric field detection device 40 of the present embodiment shown in FIG. 6, a substrate 53 has an approximately rectangular shape in a plan view, and the light incident end surface of an optical waveguide 54 (i.e., first optical waveguide) and an optical waveguide 55 (i.e., second optical waveguide) are formed on a side 53a (i.e., one side of the rectangular shape) and the light emission end surface of the optical waveguide 54 and the optical waveguide 55 is formed on a side 53b which is opposite to the side 53a. Therefore, the optical waveguide 54 and the optical waveguide 55 respectively have curved optical waveguides 54a, 55a for introducing the incident light entered from the incident end to the modulator electrodes and curved optical waveguides 54b, 55b for introducing the emitted light emitted from the modulator electrodes to the emission end. Because of this, the end surfaces to be polished for connecting with the optical fiber is only two end surfaces, and the manufacturing process is significantly simplified. In addition, since the end surfaces to which the optical fibers are connected are also only two end surfaces, the handling is facilitated. In case of the titanium-diffuse optical waveguide on the lithium niobate crystal substrate, for example, the electric field detection device 40 of the present embodiment can be easily performed since the radiation loss is small enough when the radius of curvature of the optical waveguide is approximately 30 mm or more.

Fifth Embodiment

Figure 7:
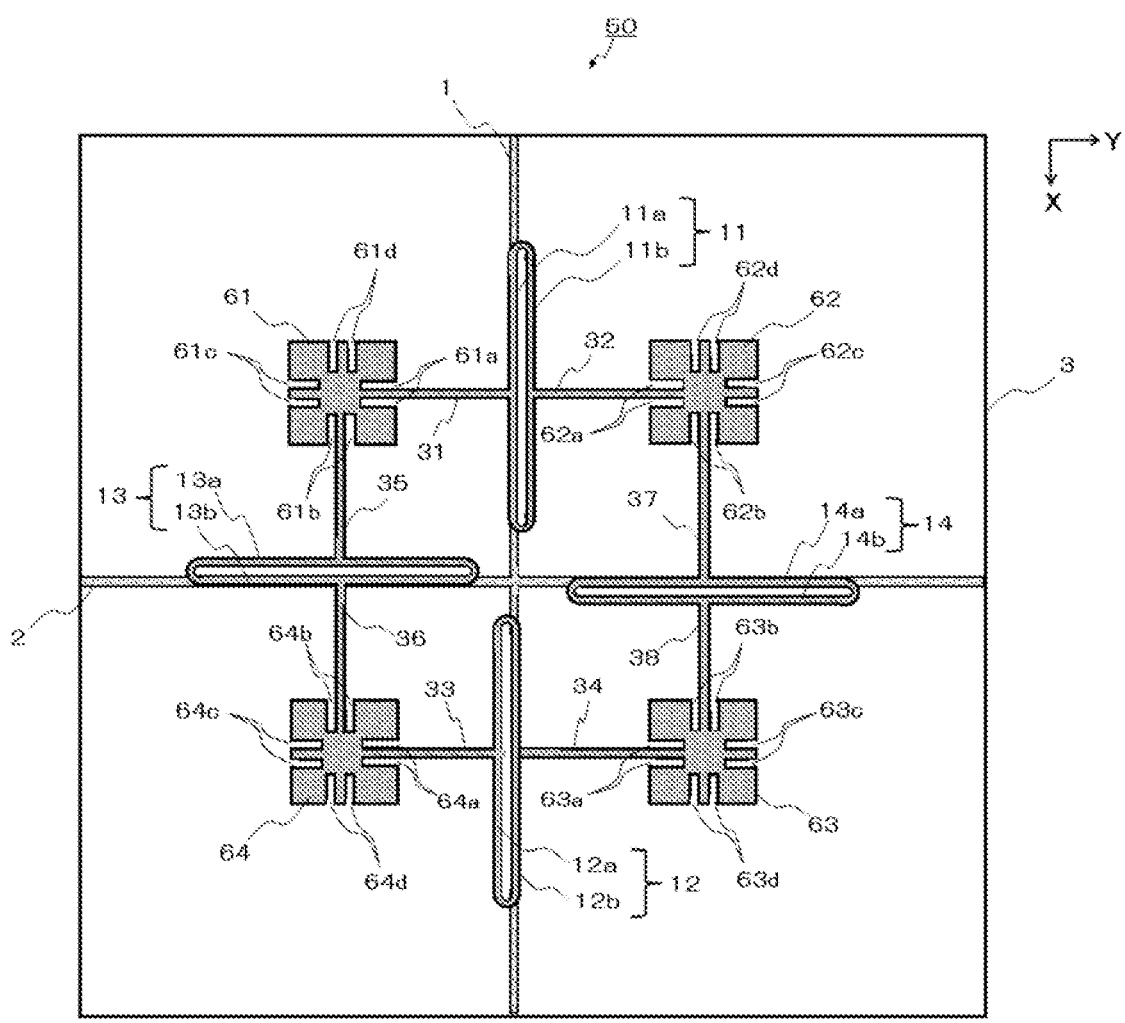
FIG. 7 is a schematic plan view showing the configuration of the electric field detection device of the fifth embodiment.

FIG. 7 is a schematic plan view showing the configuration of the electric field detection device of the fifth embodiment. In FIG. 7, an electric field detection device 50 of the present invention has the same configuration as the electric field detection device 10 of the first embodiment except for that the first to fourth patch antennas are different.

In the electric field detection device 50 of the present embodiment shown in FIG. 7, all of an antenna 61 (i.e., first patch antenna), an antenna 62 (i.e., second patch antennas) an antenna 63 (i.e., third patch antenna) and an antenna 64 (i.e., fourth patch antenna) have another slit portions having an approximately same shape as the slit portions, and the another slit portions are located on an opposite side to a side having the slit portion and at a position symmetric to the slit portion. Namely, the antennas 61 have slit portions 61c having an approximately same shape as the slit portions 61a provided on both ends of a feeder line 31 and the slit portions 61c are located on an opposite side to a side having the slit portions 61a and at a position symmetric to the slit portion 61a. In addition, the antennas 61 have slit portions 61d having an approximately same shape as the slit portions 61b provided on both ends of a feeder line 35 and the slit portions 61d are located on an opposite side to a side having the slit portions 61b and at a position symmetric to the slit portion 61b. Similarly, the antennas 62 have slit portions 62c, 62d which are symmetric to the slit portions 62a, 62b, the antennas 63 have slit portions 63c, 63d which are symmetric to the slit portions 63a, 63b, and the antennas 64 have slit portions 64c, 64d which are symmetric to the slit portions 64a, 64b.

In the present embodiment, the values of the length of one side of the antennas 61 to 64 and the length of one of the slit portions can be same as those of the first embodiment. For example, when the frequency of the electromagnetic wave to be detected is set to 28 GHz, the length of each of the slit portions can be approximately 0.59 mm and the width of the interval of each of the slit portions can be approximately 30 μm.

In the square patch antennas, when asymmetric slit portions are formed like the antennas 21 to 24 of the first embodiment, the symmetry of the shape between the X-direction and Y-direction is lost and the resonance characteristic of the antennas is slightly deteriorated even if the size of the slit portions is small. In the antennas 61 to 64 of the present embodiment, the slit portions are provided also on the opposite side of the side connected to the feeder lines. Thus, the symmetry of the shape between the X-direction and Y-direction can be improved and the deterioration of the resonance characteristic due to the asymmetric shape of the antennas can be improved.

It goes without saying that the present invention is not limited to the above described embodiments. The configuration and shape of the optical waveguides, the antennas, the modulator electrodes, the feeders and other components can be modified in various ways.

DESCRIPTION OF THE REFERENCE NUMERALS 1, 2, 54, 55: optical waveguide
3, 17, 53: substrate
4: electric field detector 5: light source
8: optical spectrum analyzer
9: optical splitter
10, 20, 30, 40, 50: electric field detection device
11, 12, 13, 14, 18, 19, 41, 42, 43, 44: modulator electrode
11a, 11b, 12a, 12b, 13a, 13b, 14a, 14b, 41a, 41b, 42a, 42b, 43a, 43b, 44a, 44b: strip electrode
21, 22, 23, 24, 61, 62, 63, 64: antenna
25, 26, 27, 28: optical fiber
31, 32, 33, 34, 35, 36, 37, 38: feeder
51, 52: polarization inversion region
54a 54b, 55a, 55b: curved optical waveguide
61a, 61b, 61c, 61d, 62a, 62b, 62c, 62d, 63a, 63b, 63c, 63d, 64a, 64b, 64c, 64d: slit portion

What is claimed is:

1. An electric field detection device, comprising:
a substrate made of a material having an electro-optic effect;
first and second optical waveguides formed on the substrate and crossed with each other;
four modulator electrodes prepared for applying an electric field to the first optical waveguide and the second optical waveguide; and
four patch antennas arranged on the substrate, wherein
the four patch antennas are comprised of first, second, third and fourth patch antennas arranged respectively around four corners of a rectangular shape in clockwise order,
the first optical waveguide is arranged to pass between the first and second patch antennas and between the third and fourth patch antennas,
the second optical waveguide is arranged to pass between the first and fourth patch antennas and between the second and third patch antennas,
the four modulator electrodes are comprised of:
a first modulator electrode energized from the first and second patch antennas;
a second modulator electrode energized from the fourth and third patch antennas;
a third modulator electrode energized from the first and fourth patch antennas; and
a fourth modulator electrode energized from the second and third patch antennas,
the first modulator electrode and the second modulator electrode are arranged along the first optical waveguide,
the third modulator electrode and the fourth modulator electrode are arranged along the second optical waveguide,
a first light wave propagating through the first optical waveguide is modulated by a first voltage signal induced between the first and second patch antennas and a second voltage signal induced between the third and fourth patch antennas, and
a second light wave propagating through the second optical waveguide is modulated by a third voltage signal induced between the first to fourth patch antennas and a fourth voltage signal induced between the second and third patch antennas.

2. The electric field detection device according to claim 1, wherein
the first to fourth modulator electrodes are configured to resonate at frequencies of the first to fourth voltage signals induced on the four patch antennas respectively.

3. The electric field detection device according to claim 2, wherein
each of the four modulator electrodes has a pair of strip-shaped electrode portions arranged to face each other at a predetermined interval along the first optical waveguide or the second optical waveguide, and
a resonator is configured by short-circuiting or opening both ends of the pair of strip-shaped electrode portions.

4. The electric field detection device according to claim 3, wherein
the first light wave modulated by the first modulator electrode is configured to increase the modulation degree when the first light wave passes through the second modulator electrode, and
the second light wave modulated by the third modulator electrode is configured to increase the modulation degree when the second light wave passes through the fourth modulator electrode.

5. The electric field detection device according to claim 4, wherein
the relative position is different between the pair of strip-shaped electrode portions of the second modulator electrode and the pair of strip-shaped electrode portions of the first modulator electrode in the width direction of the first optical waveguide,
the direction of the electric field applied to the first optical waveguide by the second modulator electrode is opposite to the direction of the electric field applied to the first optical waveguide by the first modulator electrode,
the relative position is different between the pair of strip-shaped electrode portions of the fourth modulator electrode and the pair of strip-shaped electrode portions of the third modulator electrode in the width direction of the second optical waveguide, and
the direction of the electric field applied to the second optical waveguide by the fourth modulator electrode is opposite to the direction of the electric field applied to the second optical waveguide by the third modulator electrode.

6. The electric field detection device according to claim 4, wherein
the polarization direction at a second region of the substrate to which the second voltage signal is applied by the second modulator electrode and a fourth region of the substrate to which the fourth voltage signal is applied by the fourth modulator electrode is inverted with respect to the polarization direction at a first region of the substrate to which the first voltage signal is applied by the first modulator electrode and a third region of the substrate to which the third voltage signal is applied by the third modulator electrode.

7. The electric field detection device according to claim 4, wherein
a second feeder line for energizing from the third and fourth patch antennas to the second modulator electrode is different from a first feeder line for emerging from the first and second patch antennas to the first modulator electrode,
the direction of the electric field applied to the first optical waveguide by the second modulator electrode is opposite to the direction of the electric field applied to the first optical waveguide by the first modulator electrode,
a fourth feeder line for energizing from the second and third patch antennas to the fourth modulator electrode is different from a third feeder line for emerging from the first and fourth patch antennas to the third modulator electrode, and
the direction of the electric field applied to the second optical waveguide by the fourth modulator electrode is opposite to the direction of the electric field applied to the second optical waveguide by the third modulator electrode.

8. The electric field detection device according to claim 1, wherein the four patch antennas are four square patch antennas.

9. The electric field detection device according to claim 8, wherein the four square patch antennas have first slit portions at both ends of each of the first to fourth feeder lines connected to the four square patch antennas so that impedance is matched between the four square patch antennas and the first to fourth feeder lines for emerging the first to fourth modulator electrodes connected to the four square patch antennas.

10. The electric field detection device according to claim 9, wherein the four square patch antennas have second slit portions having an approximately same shape as the first slit portions, and the second slit portions are located on an opposite side to a side having the first slit portion and at a position symmetric to the first slit portion.

11. The electric field detection device according to claim 1, wherein the first and second optical waveguides are crossed with each other at an angle of 70° to 110°.

12. The electric field detection device according to claim 1, wherein the wavelength of the first light wave propagating through the first optical waveguide is different from the wavelength of the second light wave propagating through the second optical waveguide.

13. The electric field detection device according to claim 1, wherein the substrate has an approximately rectangular shape in a plan view, each of the first and second optical waveguides has a curved optical waveguide, a light incident end surface of the first and second optical waveguides is formed on one side of the approximately rectangular shape, and a light emission end surface of the first and second optical waveguides is formed on an opposite side of the approximately rectangular shape opposite to the light incident end surface.

14. An electric field detector, comprising:

the electric field detection device according to claim 1;

a light source for supplying the first and second light waves propagating through the first and second optical waveguides; and a processor for converting the first and second light waves emitted from the first and second optical waveguides into an electric signal, outputting a first signal which corresponds to a first electric field signal between the first and second patch antennas and between the fourth and third patch antennas from the electric signal, and outputting a second signal which corresponds to a second electric field signal between the first and fourth patch antennas and between the second and third patch antennas.

* * * * *